US009818064B1

(12) United States Patent
Abdo

(10) Patent No.: US 9,818,064 B1
(45) Date of Patent: Nov. 14, 2017

(54) HIGH FIDELITY THRESHOLD DETECTION OF SINGLE MICROWAVE PHOTONS USING A QUANTUM NON-DEMOLITION PHOTON DETECTOR

(71) Applicant: INTERNATIONAL BUSINESS MACHINES CORPORATION, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/290,530

(22) Filed: Oct. 11, 2016

(51) Int. Cl.
G06N 99/00 (2010.01)
G01R 29/08 (2006.01)

(52) U.S. Cl.
CPC ....... G06N 99/002 (2013.01); G01R 29/0814 (2013.01)

(58) Field of Classification Search
CPC .................................................. G06N 99/002
See application file for complete search history.

(56) References Cited

U.S. PATENT DOCUMENTS

| 4,024,396 A | 5/1977 | Hill et al. |
| 8,817,254 B2 | 8/2014 | Santori et al. |
| 9,255,839 B2 | 2/2016 | Möttönen et al. |
| 2014/0314419 A1* | 10/2014 | Paik ...................... H04B 10/70 398/115 |
| 2016/0028403 A1 | 1/2016 | McCaughan et al. |

FOREIGN PATENT DOCUMENTS

| JP | 2009218380 A | 9/2009 |
| JP | 2010109697 A | 5/2010 |
| JP | 015015590 A | 1/2015 |
| JP | 2015015590 A | 1/2015 |

OTHER PUBLICATIONS

Andersen et al., "Quantized Resonator Field Coupled to a Current-Biased Josephson Junction in Circuit QED", arXiv:1312.5863v2, 2014, pp. 1-10.
Chen et al., "Emulating Weak Localization Using a Solid-State Quantum Circuit," Nature Communications, vol. 5, 2014, pp. 1-6.
Chen et al., "Microwave Photon Counter Based on Josephson Junctions", Physical Review Letters, PRL 107, 217401, Nov. 18, 2011, pp. 1-5.
Fan et al., "Non-Absorbing High-Efficiency Counter for Itinerant Microwave Photons", arXiv:1403.4465v2, 2014, pp. 1-5.
Govia et al., "High-Fidelity Qubit Measurement with a Microwave Photon Counter," arXiv:1502.01564v1, 2015, pp. 1-14.

(Continued)

Primary Examiner — David Porta
Assistant Examiner — Hugh H Maupin
(74) Attorney, Agent, or Firm — Cantor Colburn LLP; Vazken Alexanian

(57) ABSTRACT

A technique relates to a microwave detection device. A quantum non-demolition microwave photon detector is connected to a quadrature microwave hybrid coupler connected. A dispersive nonlinear element is coupled to the quadrature microwave hybrid coupler.

25 Claims, 14 Drawing Sheets

(56) References Cited

OTHER PUBLICATIONS

Hosseini et al., "Partially Nondestructive Continuous Detection of Individual Traveling Optical Photons," Phys. Rev. Lett. 116, 033602, Jan. 2016, pp. 1-5.
Mendes et al., "Electron-Photon Interaction in a Quantum Point Contact Coupled to a Microwave Resonator," Phys. Rev. B 93, 235450 arXiv:1604.03830v1, Apr. 2016, pp. 1-16.
Peropadre et al., "Approaching Perfect Microwave Photodetection in Circuit QED," Physical Review A 84, 063834, 2011, pp. 1-8.
Poudel et al., "Quantum Efficiency of a Microwave Photon Detector based on a Current-Biased Josephson Junction," arXiv:1201.2990v2, 2013, pp. 1-5.
Romero et al., "Microwave Photon Detector in Circuit QED", arXiv:0811.3909v2, 2009, pp. 1-4.
Sathyamoorthy et al., "Quantum Nondemolition Detection of a Propagating Microwave Photon", arXiv:1308.2208v2, 2013, pp. 1-13.

* cited by examiner

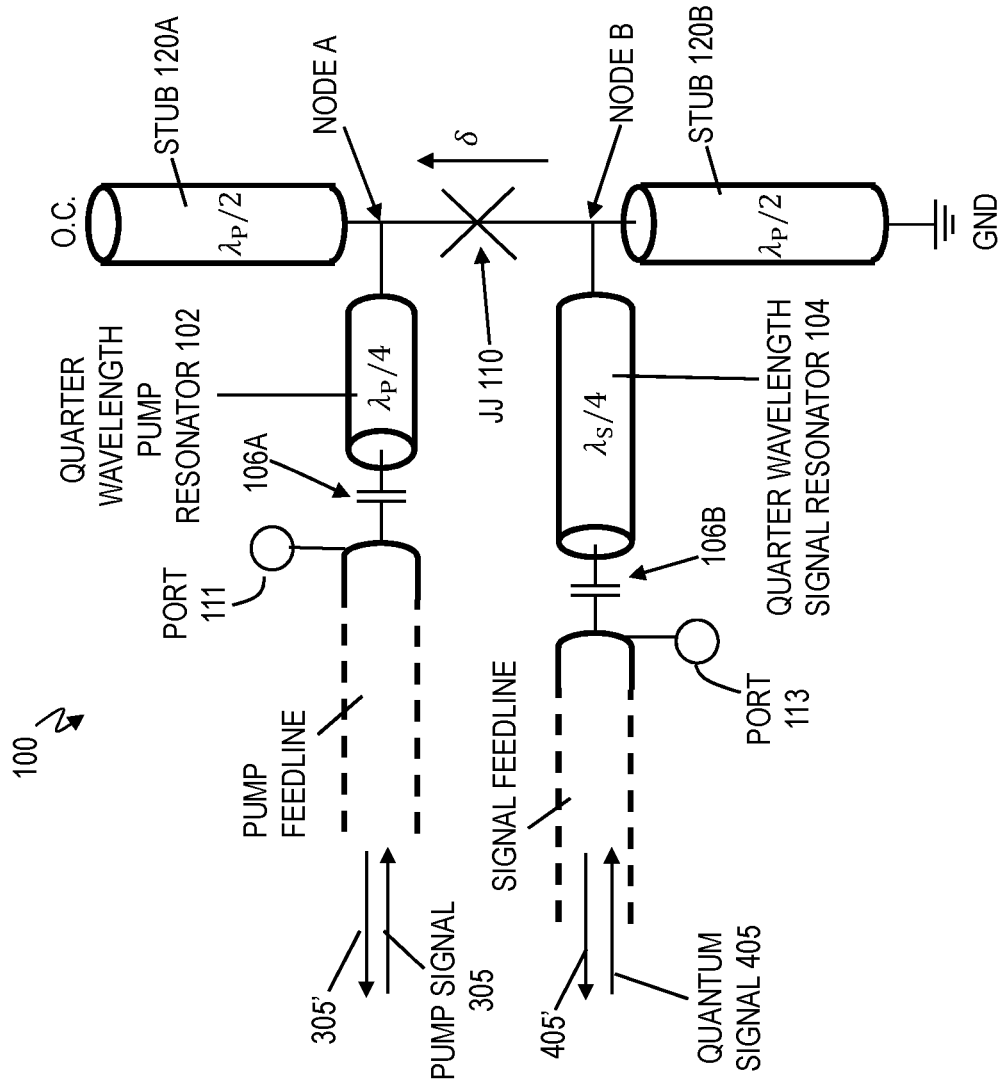

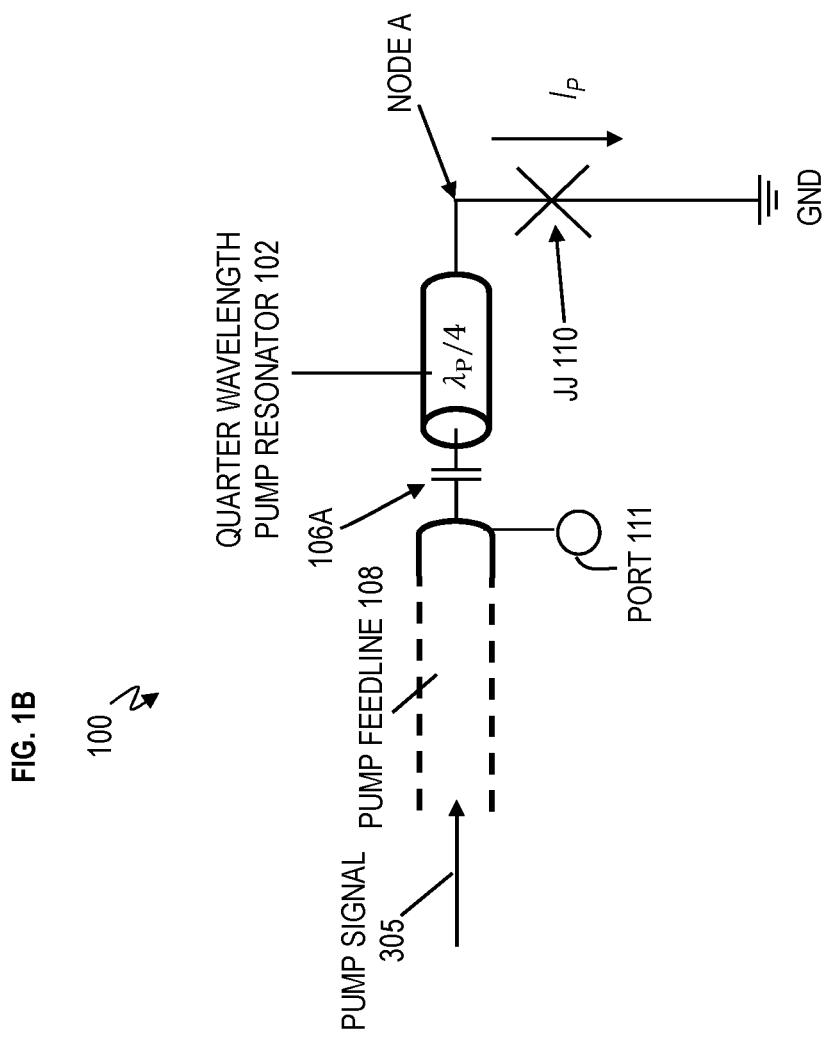

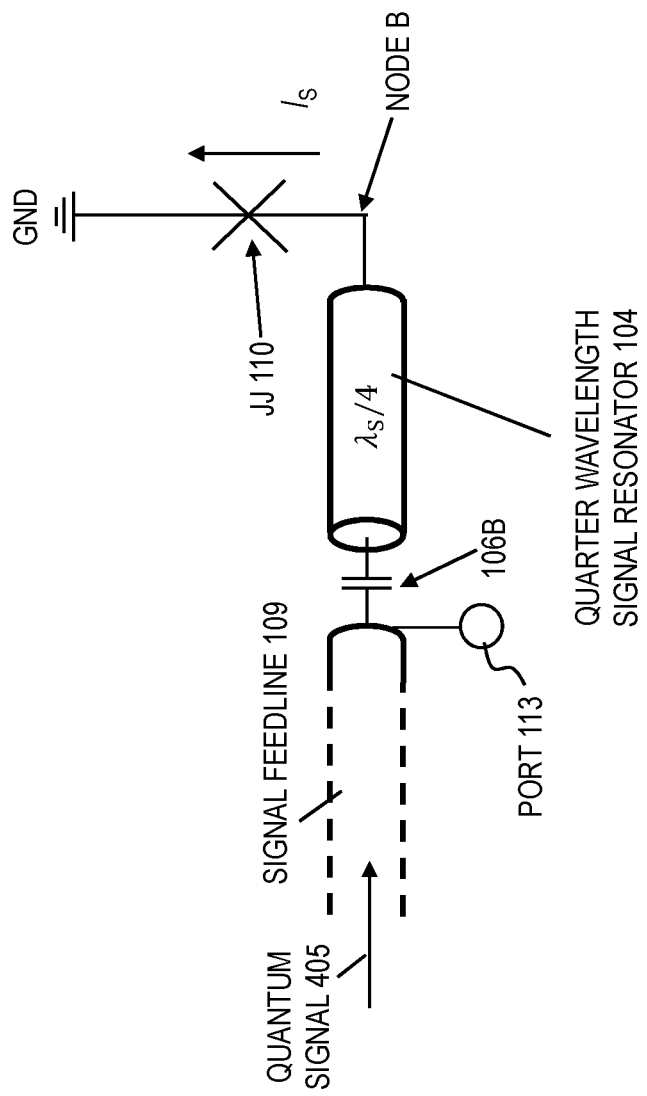

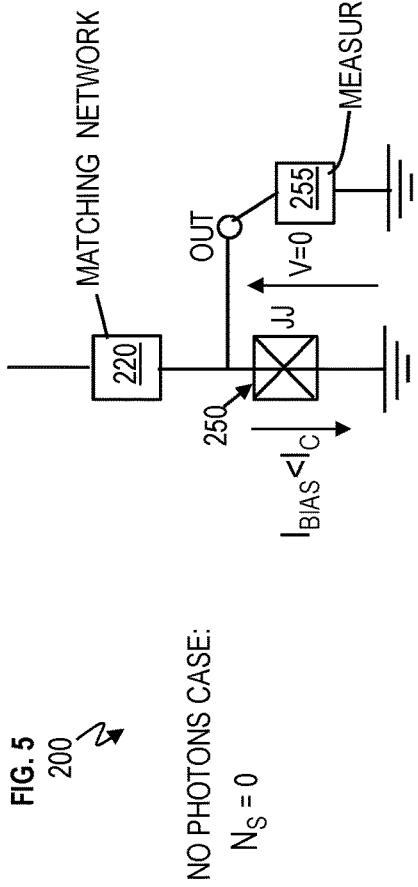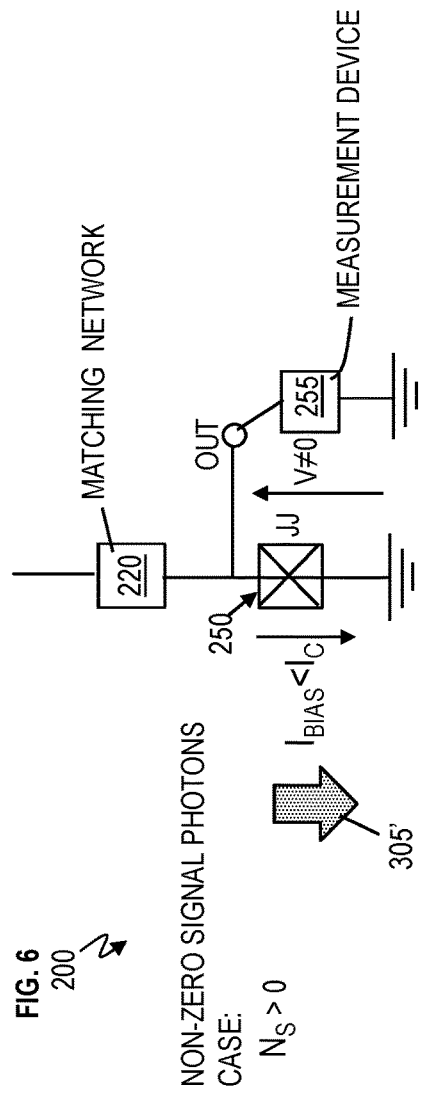

RECEIVE, BY A QUADRATURE MICROWAVE HYBRID COUPLER, A REFLECTED MICROWAVE SIGNAL FROM A QUANTUM NON-DEMOLITION MICROWAVE DEVICE 1405

DETERMINE A PRESENCE OF THE MICROWAVE PHOTON BASED ON A NONLINEAR DISPERSIVE ELEMENT BEING IN A VOLTAGE STATE, THE NONLINEAR DISPERSIVE ELEMENT BEING COUPLED TO THE QUADRATURE MICROWAVE HYBRID COUPLER 1410

1500

HIGH FIDELITY THRESHOLD DETECTION OF SINGLE MICROWAVE PHOTONS USING A QUANTUM NON-DEMOLITION PHOTON DETECTOR

BACKGROUND

The present invention relates to superconducting electronic devices, and more specifically, to high fidelity threshold detection of single microwave photons using a quantum non-demolition photon detector.

In the state-of-the-art, in the optical frequency domain, reliable single photon detectors such as photomultipliers, microwave kinetic inductance detectors, and superconducting nanowire single-photon detectors are widely used in various experiments and applications. However, one disadvantage of these devices is that they destroy (i.e., absorb) the photons that they detect. In contrast, in the microwave domain, i.e., the gigahertz (GHz) range, reliable and practical single photon detectors are still under research and development.

SUMMARY

According to one or more embodiments, a microwave detection device is provided. The microwave detection device includes a quantum non-demolition microwave photon detector, a quadrature microwave hybrid coupler connected to the quantum non-demolition microwave photon detector, and a dispersive nonlinear element coupled to the quadrature microwave hybrid coupler.

According to one or more embodiments, a method of forming a microwave detection device is provided. The method includes providing a quantum non-demolition microwave photon detector, providing a quadrature microwave hybrid coupler connected to the quantum non-demolition microwave photon detector, and providing a dispersive nonlinear element coupled to the quadrature microwave hybrid coupler.

According to one or more embodiments, a method of detecting a microwave photon is provided. The method includes receiving, by a quadrature microwave hybrid coupler, a reflected microwave signal from a quantum non-demolition microwave device. Also, the method includes determining a presence of the microwave photon based on a dispersive nonlinear element being in a voltage state. The dispersive nonlinear element is coupled to the quadrature microwave hybrid coupler.

According to one or more embodiments, a method of detecting an absence of a microwave photon is provided. The method includes receiving, by a quadrature microwave hybrid coupler, a reflected microwave signal from a quantum non-demolition microwave device. Also, the method includes determining the absence of the microwave photon based on a dispersive nonlinear element being in a zero-voltage state. The dispersive nonlinear element is coupled to the quadrature microwave hybrid coupler.

BRIEF DESCRIPTION OF THE DRAWINGS

FIG. 1A is a schematic of a microwave device according to one or more embodiments.

FIG. 1B is a schematic of the pump equivalent circuit of the microwave device as seen by (or affected by) the pump port according to one or more embodiments.

FIG. 1C is a schematic of the signal equivalent circuit of the microwave device as seen by the quantum signal port according to one or more embodiments.

FIG. 5 is a schematic of the system depicting in-situ single microwave photon detection according to one or more embodiments.

FIG. 6 is a schematic of the system depicting in-situ single microwave photon detection according to one or more embodiments.

FIG. 14 is a flow chart of a method of detecting a microwave photon according to one or more embodiments.

DETAILED DESCRIPTION

Figure 2:
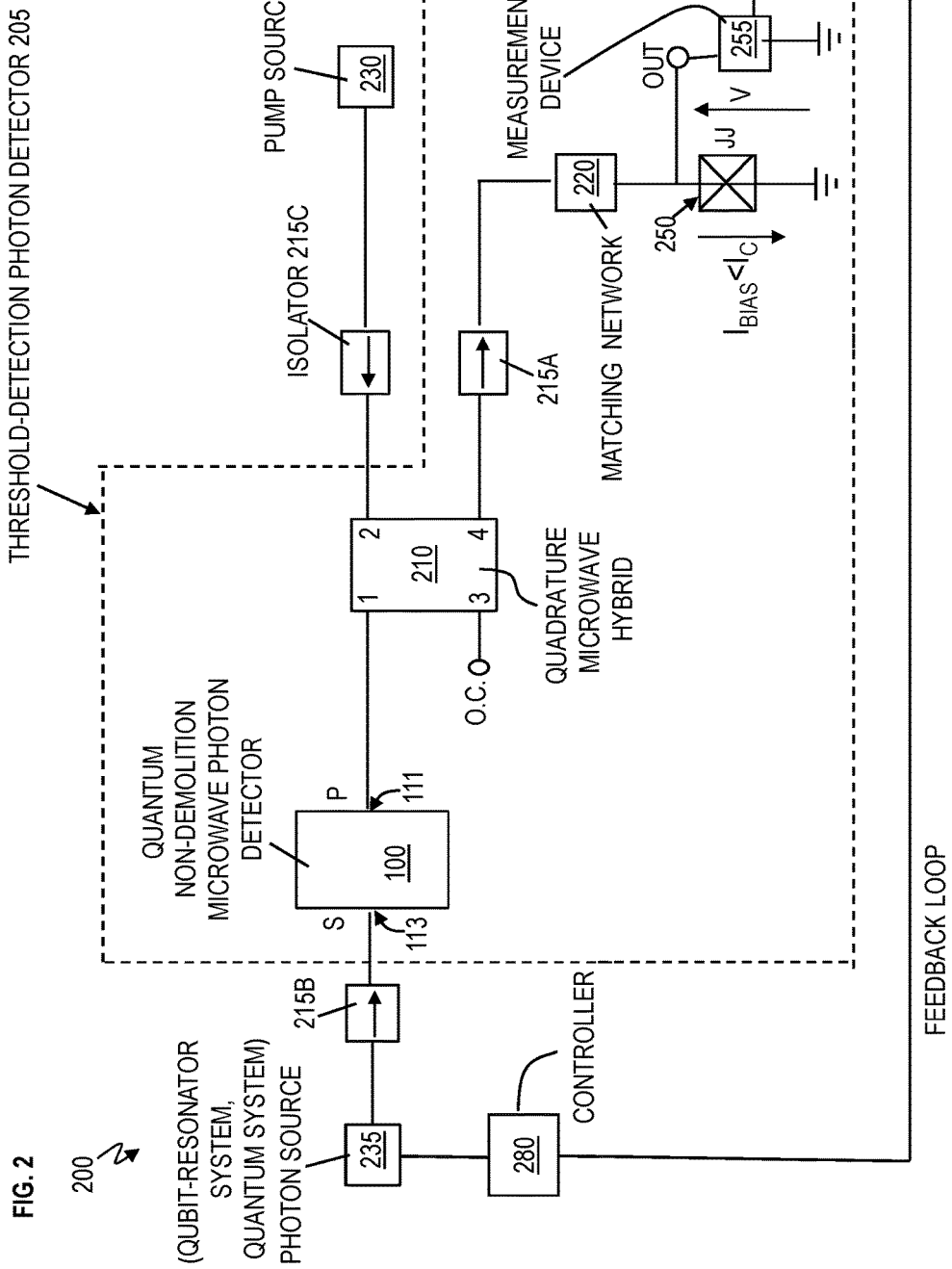
FIG. 2 is a schematic of a system according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

A photon is an elementary particle, which is a quantum of light along with all other forms of electromagnetic radiation. A photon carries energy proportional to the radiation frequency and has zero rest mass. One reason why the detection of single microwave photons is a challenge is because the energy of a single microwave photon is very small. The energy of a photon in the microwave domain, for example, in the range 1-10 gigahertz (GHz), is at least $10^4$ times smaller than the energy of a visible light photon.

Circuit quantum electrodynamics (cQED) is one of the leading architectures for realizing a quantum computer based on superconducting microwave circuits. It employs artificial atoms made of nonlinear superconducting devices, called qubits, which are dispersively coupled to microwave resonators, i.e., the frequencies of the qubits and resonators are detuned. As one example, each superconducting qubit can include one or more Josephson junctions shunted by capacitors in parallel with the junctions. The qubits are capacitively coupled to two-dimensional (2D) planar waveguide resonators or three-dimensional (3D) microwave cavities. The electromagnetic energy associated with the qubit is stored in the Josephson junctions and in the capacitive and inductive elements forming the qubit. Presently, a major focus has been on improving lifetimes of the qubits in order to allow calculations (i.e., manipulation and readout) to take place before the information is lost due to decoherence of the qubits.

Dispersively coupling a superconducting qubit to a microwave resonator in a cQED architecture loads the resonator and makes its resonance frequency dependent on the quantum state of the qubit (i.e., the resonance frequency of the resonator is different depending on whether the qubit is in the ground or excited state). This property enables the performance of quantum non-demolition measurement of the qubit state, by sending a microwave signal having a few photons to the cQED near the resonator frequency, and measuring the amplitude and/or phase of the output microwave field that carries information about the qubit state. Thus, one potential application of a working and reliable single photon detector in the microwave domain is to enable measuring this weak output signal (i.e., detecting the qubit state) inside the dilution fridge, without requiring the use of high-gain, low-noise, and high-isolation output chains that are typically used in the state-of-the-art in order to perform such measurements.

One or more embodiments provide a non-demolition threshold-detection scheme for detecting the absence or presence of photons. A threshold-detection photon detector/system includes of a non-demolition single microwave photon detector that is based on the cross-Kerr effect, a symmetric 3 dB coupler (90° degree hybrid), an isolator/attenuator, a matching circuit/network, and a DC-current biased Josephson junction. The threshold-detection photon detector/system is microwave device for detecting single microwave photons. Embodiments are configured to 1) detect single photons within a certain bandwidth in the microwave domain, (i.e., in the gigahertz (GHz) range, e.g., the 1-20 GHz range), and 2) perform the detection of the photons in a non-demolition manner, i.e., without destroying (or absorbing) the photons being detected.

Turning now to aspects of the present invention, FIG. 1A is a schematic of a microwave device 100 according to one or more embodiments. The microwave device 100 includes a quarter-wavelength resonator 102 for the pump drive and a quarter-wavelength resonator 104 for the quantum signals. One end of the pump resonator 102 is connected to a coupling capacitor 106A, and the coupling capacitor 106A connects to a pump feedline/transmission line. The pump feedline is connected to pump port 111 and/or the pump port 111 is on the pump feedline. The pump feedline receives a microwave pump signal 305 (i.e., a strong microwave tone) from a microwave generator or a pump source. The other end of the pump resonator 102 connects to both a dispersive nonlinear element, e.g., Josephson junction (JJ) 110 and connects to a half-wavelength stub 120A at the pump frequency. The connection of the pump resonator 102, JJ 110, and stub 120A can be designated as node A. Opposite the node A, the stub 120A is terminated at an open circuit (O.C.).

In the microwave device 100, one end of the quarter-wavelength signal resonator 104 is connected to a coupling capacitor 106B, and the coupling capacitor 106B connects to a signal feedline/transmission line. The signal feedline is connected to a signal port 113 and/or the signal port 113 is on the signal feedline. The signal feedline is configured to receive a microwave quantum signal 405, i.e., microwave signal being measured/tested, from a quantum device. The quantum device can be a qubit, a cavity/resonator coupled to a qubit, a photon source, a qubit-resonator system, etc. The other end of the signal resonator 104 connects to the JJ 110 and connects to a half-wavelength stub 120B at the pump frequency. The connection of the signal resonator 104, JJ 110, and stub 120B can be designated as node B. Opposite the node B, the stub 120B is terminated as a short circuit because the ground acts like a short circuit with respect to the application of a microwave signal. The signal feedline can be connected to the quantum device.

The pump resonator 102 has a fundamental mode, which can be referred to as the pump mode or pump resonance mode. The pump mode of the pump resonator 102 has a resonance frequency, which can be referred to as the pump resonance frequency $f_P$. The pump mode of the pump resonator 102 has a wavelength $\lambda_P$, where $\lambda_P = c'/f_P$ and c' is the speed of light in the transmission line or waveguide used in the implementation of the pump resonator 102. The microwave pump signal 305 applied to the pump resonator 102 is a strong coherent resonant tone (i.e., its frequency matches the resonance frequency of the pump resonator 102). The pump resonator 102 is designed to have a length corresponding to $\lambda_P/4$, which is a quarter the wavelength of the pump signal. The stubs 120A and 120B are each designed to have a length corresponding to $\lambda_P/2$, which is half the wavelength of the pump signal 305.

The signal resonator 104 has a fundamental mode, which can be referred to as the signal mode or signal resonance mode. The signal mode of the signal resonator 104 has a resonance frequency, which can be referred to as the signal resonance frequency $f_S$. The quantum microwave signal 405 input to the signal resonator is a weak resonant tone having a few single photons, whose frequency $f_S$ matches the resonance frequency of the signal mode. The signal mode of the signal resonator 104 has a wavelength $\lambda_S$, where $\lambda_S = c'/f_S$ and c' is the speed of light in the transmission line or waveguide used in the implementation of the device. The signal resonator 104 is designed to have a length corresponding to $\lambda_S/4$, which is a quarter the wavelength of the quantum signal 405.

The microwave device 100 has a frequency condition between the (pump) resonance frequency of the pump resonator 102 and the (signal) resonance frequency of the signal resonator 104. The frequency condition is that the pump resonance frequency $f_P$ of the pump resonator 102 is equal to twice the signal resonance frequency $f_S$ of the signal resonator 104. In other words, the frequency condition is $f_P = 2 \cdot f_S$. Accordingly, the applied pump signal 305 has a frequency $f_P$ that is twice the frequency $f_S$ of the quantum signal 405.

The microwave device 100 (and/or operation via pump signal 305 and quantum signal 405) is configured such that it can be described by the effective Hamiltonian (without the drives and feedlines) $H_{eff} = \hbar \tilde{\omega}_P N_P + \hbar \tilde{\omega}_S N_S + \hbar K N_P^2 + \hbar K' N_P N_S$, where $\hbar \tilde{\omega}_P N_P$ represents the pump resonance mode term (modeled as a harmonic oscillator with $\tilde{\omega}_P$ as the dressed resonance frequency of the pump resonance mode), $\hbar \tilde{\omega}_S N_S$ represents the signal resonance mode term (modeled as a harmonic oscillator with $\tilde{\omega}_S$ as the dressed resonance frequency of the signal resonance mode), $\hbar K N_P^2$ represents the self-Kerr nonlinearity of the device, and $\hbar K' N_P N_S$ represents the cross-Kerr nonlinearity of the device. Further, K is the self-Kerr constant (i.e., the Kerr frequency shift per photon), and K' is the cross-Kerr constant (i.e., the cross-Kerr frequency shift per photon). Additionally, $N_P$ is the photon number operator of the pump mode (whose eigenvalue is the number of photons in the pump resonance mode), where $N_P = \alpha_P^\dagger \alpha_P$, and $N_S$ is the photon number operator of the signal mode (whose eigenvalue is the number of photons in the signal resonance mode), where $N_S = \alpha_S^\dagger \alpha_S$, and $\hbar = h/2\pi$, where h is Planck's constant. Also, $\alpha_P$ and $\alpha_S$ are quantum operators (i.e., annihilation operators) associated with the pump and signal resonance modes). It is noted that sometimes in this document the symbols $N_P$, $N_S$ can be utilized to represent the eigenvalues of the number operators and not the number operators themselves. It is also noted that any person skilled in the art can easily make this distinction from the context.

FIG. 1B is a schematic of the pump equivalent circuit of the microwave device 100 as seen by (or affected by) the pump port 111 according to one or more embodiments. In addition to illustrating what the pump port 111 sees, FIG. 1B concurrently illustrates the circuit as seen by the incoming pump signal 305 at the pump resonance frequency $f_P$. Accordingly, discussion regarding the pump port 111 applies to the incoming pump signal 305.

In the pump equivalent circuit, FIG. 1B shows the pump feedline (including pump port 111) coupled to the transmission line part of the pump resonator 102 via the coupling capacitor 106A, and the other end of the transmission line part of the pump resonator connected to ground via the Josephson junction 110. To explain this equivalent circuit, it is noted that 1) stub 120A, which serves as an impedance transformer, is terminated as an open circuit and its length corresponds to half the wavelength of the pump signal 305, thus node A sees an open circuit at the pump frequency, and 2) stub 120B, which serves as an impedance transformer, is terminated as a short circuit and its length corresponds to half the wavelength of the pump signal 305, thus node B sees a short circuit at the pump frequency.

One beneficial result of this pump equivalent circuit is that it shows that the pump resonance mode does not see (i.e., is not affected by) the signal resonator 104. In other words, the pump resonator 102 is isolated from the signal resonator 104. Another beneficial result is that the RF-current $I_P$ associated with the pump resonance mode has an anti-node at the location of the Josephson junction 110.

FIG. 1C is a schematic of the signal equivalent circuit of the microwave device 100 as seen by the quantum signal port 113 according to one or more embodiments. In addition to illustrating what the signal port 113 sees, FIG. 1C concurrently shows the equivalent circuit as seen by the incoming quantum signal 405 at the signal resonance frequency $f_S$. Accordingly, discussion regarding the signal port 113 applies to the incoming quantum signal 405.

In the equivalent circuit of the microwave device 100 which is seen by the signal port, FIG. 1C shows the signal feedline (including signal port 113) coupled to the transmission line part of the signal resonator 104 via the coupling capacitor 106B, and the other end of the transmission line part of the signal resonator 104 connected to ground via the Josephson junction 110. Because the frequency condition for the pump frequency is $f_P = 2 \cdot f_S$ (the fundamental resonance mode of the pump resonator 102 corresponds to the pump frequency $f_P$ while the fundamental resonance mode of the signal resonator 104 corresponds to the signal frequency $f_S$), the signal port 113 (quantum signal 405 at the signal resonance frequency $f_S$) sees the opposite of the pump port 111.

In this case (i.e., the case of the signal port), stub 120B, which serves as an impedance transformer, is terminated by a short circuit and its length corresponds to quarter the wavelength of the quantum signal 405, thus node B sees an open circuit at the signal resonance frequency $f_S$. Similarly, stub 120A, which serves as an impedance transformer, is terminated by an open circuit and its length corresponds to quarter the wavelength of the signal, thus node A sees a short circuit at the signal frequency $f_S$.

One beneficial result of this signal equivalent circuit is that it shows that the signal resonance mode does not see the pump resonator 102. In other words, the signal resonator 104 is isolated from the pump resonator 102. Another beneficial result is that the RF-current $I_S$ associated with the signal resonance mode has an anti-node at the location of the Josephson junction 110.

It is noteworthy to clarify here, based on FIGS. 1B and 1C, that 1) the pump resonator 102 (ignoring the coupling capacitor and feedline) consists of the quarter-wavelength transmission line at the pump frequency $f_P$ shorted to ground via the Josephson junction 110, and 2) the signal resonator 104 (ignoring the coupling capacitor and feedline) consists of the quarter-wavelength transmission line at the signal frequency $f_S$ shorted to ground via the Josephson junction 110.

The microwave device 100 is configured to couple two microwave resonance modes (i.e., the pump resonance mode and the signal resonance mode) to a common dispersive nonlinear element, i.e., Josephson junction 110. The microwave device 100 is configured to use one mode, i.e., the pump mode at the pump resonance frequency $f_P$, as a photon number detector of the photons present in the second mode, i.e., the quantum signal mode at the signal resonance frequency $f_S$. In the microwave device 100, the signal resonance frequency $f_S$ of the signal mode corresponds to the microwave frequency of the microwave photons that are to be detected and/or counted.

By driving the pump mode (of the pump resonator 102) using a strong coherent microwave tone (i.e., pump signal 305) at the pump resonance frequency $f_P$, the microwave device 100 is configured to give rise to a cross-Kerr nonlinear effect in the Josephson junction 110 which leads to a nonlinear interaction between the pump and signals modes (and consequently between the pump signal 305 at the pump resonance frequency $f_P$ and the quantum signal 405 at the signal resonance frequency $f_S$). As a result of this cross-Kerr effect, the microwave device 100 is configured such that the pump resonance frequency $f_P$ of the pump mode becomes dependent on the number of photons in the signal resonance mode at frequency $f_S$ and vice versa.

The microwave device 100 is configured such that by monitoring the phase of the reflected pump signal 305' at frequency $f_P$, a measurement/analysis device (now shown) can detect in a quantum non-demolition measurement the presence or absence of signal photons in the signal mode (i.e., detect the presence or absence of signal photons in the quantum signal 405 at frequency $f_S$ based on the size of the phase shift in the reflected pump signal 305'). Hence, the microwave device 100 can serve as a non-demolition microwave photon detector and counter. By introducing a frequency shift in the resonance frequency of the pump mode, the microwave device 100 neither absorbs nor destroys the signal photons in the quantum signal 405. Rather, the quantum signal 405' is reflected off the microwave device 100 at the signal feedline after interacting with the pump signal 305 in the device 100 via the Josephson junction 110.

It is noted that, in addition to the pump and signal modes which are measured in reflection and explained in detail above, the microwave device 100 has also two common resonance modes which can be measured in transmission between the pump and signal ports. However, these common resonance modes do not play a role in the signal-pump interaction described above and have frequencies that are far detuned from the pump and signal resonance modes (thus can be filtered out if necessary). For example, for a device with a pump resonance frequency around 16 GHz, and a signal resonance frequency around 8 GHz, the common modes of the device are expected to resonate at around 3 GHz, and 13 GHz.

Two beneficial advantages of the microwave device 100 which can be readily inferred from the device description are the following: 1) the strong pump drive (i.e., pump signal 305) which enables the detection of the signal photons is injected through a different port than the weak signal (e.g., quantum signal 405) being detected; and 2) the pump and signal modes are completely isolated from each other (due to the use of the stubs 120A and 120B). They only interact through the JJ 110 which connects their respective resonators 102 and 104. Hence, by design there should not be any direct power leakage between the pump and signal ports 111 and 113.

Now turning to an overview of a non-demolition threshold-detection scheme for detecting the absence or presence of photons, a general view of the device circuit is discussed (as shown in FIG. 2). The threshold-detection photon detector/system includes of a non-demolition single microwave photon detector that is based on the cross-Kerr effect, a symmetric 3 dB coupler (90° degree hybrid), an isolator/attenuator, a matching circuit/network, and a DC-current biased Josephson junction.

The main requirements for the non-demolition single microwave photon detector are the following: 1) a strong cross-Kerr effect at the single photon level, 2) spatial and spectral separation between the signal and pump modes, 3) sufficient isolation between the pump and the signal ports. One example of such a device is the non-demolition single microwave photon detector 100 in FIGS. 1A, 1B, and 1C. The scheme relies on wave interference between reflected pump signals off the hybrid coupler inputs (i.e., the pump port of the non-demolition microwave photon detector 100 and the second output of the hybrid terminated by an open circuit), in order to generate a large microwave signal through constructive interference at either output of the hybrid coupler depending on the presence or lack of signal photons. In the case where there is no input signal photon, the pump resonance frequency coincides with the pump drive frequency. Consequently, the reflected pump signal off the pump port of the non-demolition photon detector 100 interferes destructively with the reflected pump signal off the open-ended side of the hybrid coupler at the hybrid input connected to the JJ and thus leaves the JJ in the zero-voltage state. However, in the case where there is a signal photon (entering the signal port of the non-demolition photon detector 100), the pump resonance frequency is shifted by more than the bandwidth causing the phase of the reflected pump drive off the pump port to acquire a phase shift of +/−180 degrees which in turn results in the generation of a large reflected pump signal through constructive interference at the hybrid input connected to the JJ and thus driving the JJ into the voltage state (which can be reliably measured and detected). The shift by more than the bandwidth refers to the bandwidth of the pump resonator at the device working point.

Turning now to a more detailed view, FIG. 2 is a schematic of a system 200 according to one or more embodiments. FIG. 2 includes a threshold-detection photon detector/system 205 delineated by the dashed lines. The threshold-detection photon detector 205 is a microwave device configured to provide high-fidelity threshold detection of single microwave photons using the quantum non-demolition microwave photon detector 100. The threshold-detection photon detector/system 205 is in a cryogenic device, such as a dilution fridge. Additionally, the entire system 200 can also be in the cryogenic device.

The effective Hamiltonian of the quantum non-demolition microwave photon detector 100 which is based on Cross-Kerr nonlinearity is given by $H_{eff} = \hbar(\tilde{\omega}_P + KN_P + K'N_S)N_P \hbar \tilde{\omega}_S N_S$. Although the details of the quantum non-demolition microwave photon detector 100 have been omitted in FIG. 2 for the sake of conciseness, it is understood that the quantum non-demolition microwave photon detector 100 includes the details as discussed herein. In one implementation, the quantum non-demolition microwave photon detector 100 can be replaced by another non-demolition microwave photon detector configured to operate as discussed herein, as understood by one skilled in the art.

The threshold-detection photon detector 205 also includes a quadrature microwave hybrid coupler 210 connected to the quantum non-demolition microwave photon detector 100 and a matching circuit/network 220. In one implementation, an isolator 215A can optionally be inserted between the quadrature microwave hybrid coupler 210 and the matching network 220. In one implementation, the isolator 215A can be replaced with a resistive attenuator to prevent multiple reflections. In addition, the system/device 205 can be implemented on chip, particularly when the isolator 215A is replaced by an on-chip attenuator. In another implementation, there is no isolator 215A, and in this case, the threshold-detection photon detector 205 can rely on the dissipation of the large microwave signal in the JJ 250 to prevent multiple reflections. Also, in the threshold-detection photon detector 205, the matching network 220 is connected to a JJ 250. The matching network 220 can be an impedance transformer that is configured to match the impedance of the isolator 215A and/or quadrature microwave hybrid coupler 210 to the impedance of the JJ 250. A measurement device 255 is connected in parallel to the JJ 250 in order to measure a voltage drop across the JJ 250. In one implementation, the measurement device 255 can be part of or integrated in the threshold-detection photon detector 205. In another implementation, the measurement device 255 is separate from the threshold-detection photon detector 205.

The system 200 includes a photon source 235 connected to another isolator 215B and the isolator 215B is connected to the quantum non-demolition microwave photon detector 100 of threshold-detection photon detector 205. Additionally, the system 205 includes a microwave pump signal 230 connected to an isolator 215C, and the isolator 215C connects to one port of the quadrature microwave hybrid coupler 210. The quadrature microwave hybrid coupler 210 is a 4-port device. For explanation purposes and not limitation, the 4 ports are identified as ports 1, 2, 3, and 4.

The isolator 215B and isolator 215C are optional. In one implementation, the isolator 215B and 215C can be replaced by circulators.

The system 200 can include a controller 280. The controller 280 is connected to the measurement device 255 and the photon source (qubit-resonator) 235 via a feedback loop. The controller 280 can be an electronic circuit that replaces and/or integrates the measurement device 255, such that the controller 280 is configured to provide voltage measurement. The controller 280 can include a processing unit, memory, and computer-executable instructions in the memory. When the photon source 235 is a qubit-resonator system, the controller 280 can control and/or be integrated with microwave sources in order to cause microwave signals to be sent to the qubit-resonator based on the voltage measurement of the JJ 250.

Figure 3:
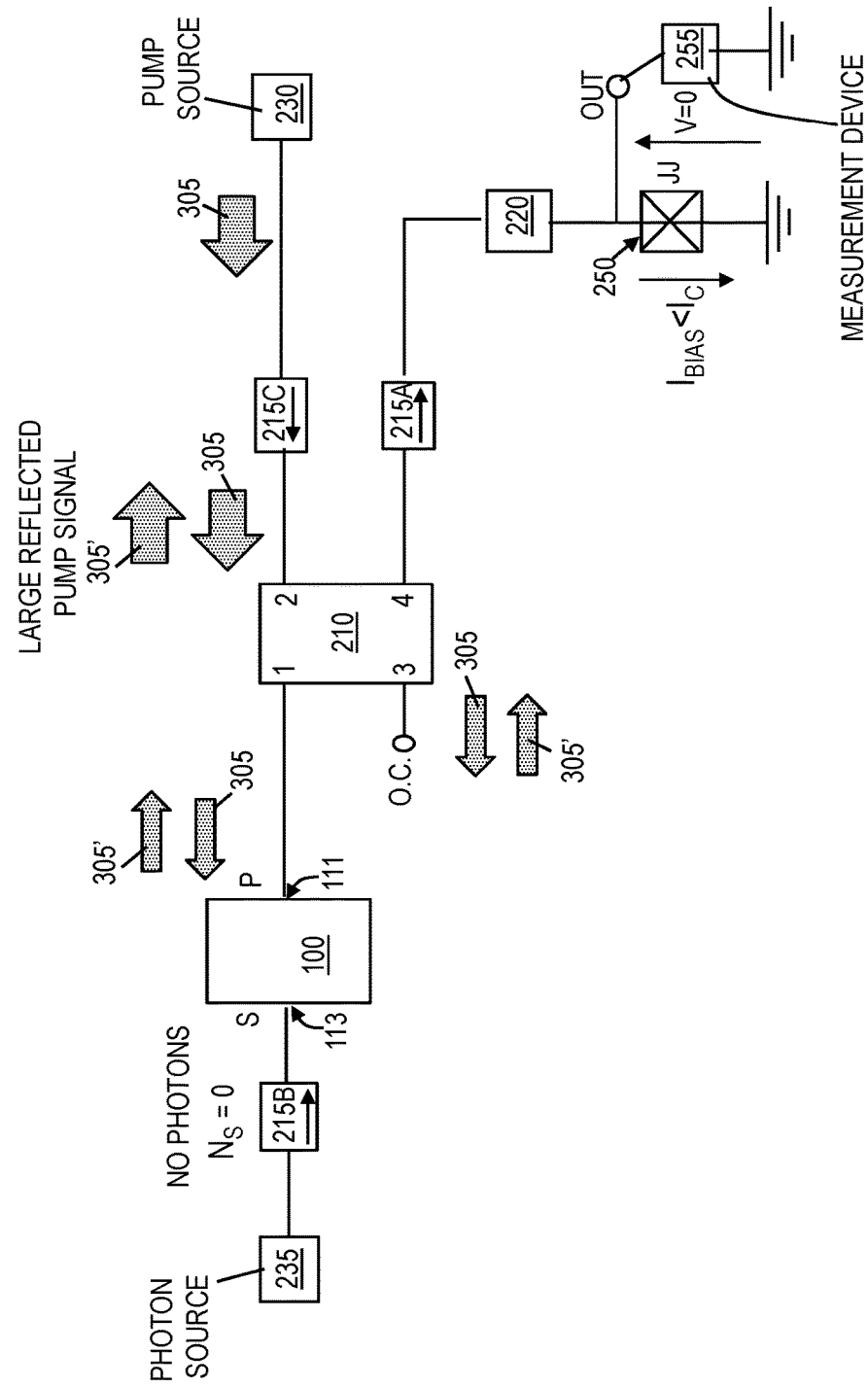
FIG. 3 is a schematic of a system depicting operation when there is no input signal of photons according to one or more embodiments.

FIG. 3 is a schematic of a system 200 depicting operation when no input signal of photons according to one or more embodiments. Particularly, FIG. 3 illustrates a scenario in which the non-demolition photon detector 100 is biased on-resonance by the microwave pump signal 305 and there is no quantum signal 405 input to the non-demolition photon detector 100.

In FIG. 3, the microwave pump signal 305 at pump frequency $f_P$ is transmitted from the pump source 230 through the isolator 215C into port 2 of the quadrature microwave hybrid coupler 210. The quadrature microwave hybrid coupler 210 is a 90° hybrid coupler. Accordingly, at the quadrature microwave hybrid coupler 210, ½ of the microwave pump signal 305 is split and output through ports 1 and 3. Port 3 of the quadrature microwave hybrid coupler 210 is connected to an open circuit, and the ½ of the microwave pump signal 305 is transmitted from the quadrature microwave hybrid coupler 210 to the open circuit. Subsequently, the microwave pump signal 305 is reflected back from the open circuit to port 3 of the quadrature microwave hybrid coupler 210 as reflected pump signal 305'.

With respect port 1, ½ of the microwave pump signal 305 is transmitted from the quadrature microwave hybrid coupler 210 to the quantum non-demolition microwave photon detector 100 at the pump port 111. The quantum non-demolition microwave photon detector 100 is configured to reflect the ½ of the microwave pump signal 305 back as ½ of the reflected microwave pump signal 305'.

In FIG. 3, when no quantum (microwave) signal 405 (i.e., no photons therefore $N_S=0$) is applied to the signal port 113 of the quantum non-demolition microwave photon detector 100, the pump resonator 102 remains on-resonance, which means that the pump resonance frequency is $f_P$ and the pump signal 305 was transmitted at the frequency $f_P$. When no quantum (microwave) signal 405 at signal frequency $f_S$ is transmitted from the photon source 235 to the quantum non-demolition microwave photon detector 100, the effective Hamiltonian of the quantum non-demolition microwave photon detector 100 that is based on Cross-Kerr nonlinearity is given by $H_{eff}=\hbar(\omega_P+KN_P)N_P$, because the $N_S$ term is equal to 0.

The quadrature microwave hybrid coupler 210 is configured to receive the microwave pump signal 305' transmitted from the quantum non-demolition microwave photon detector 100 at port 1 and to receive the microwave pump signal 305' transmitted from the open circuit at port 3. Because the pump signal 305 remains on-resonance with pump resonator 102 (i.e., the frequency of pump signal 305 is the same as the pump resonance frequency $f_P$ of the pump resonator 102), a large reflected pump signal 305' (indicated by the large arrow) is transmitted through port 2 of the quadrature microwave hybrid coupler 210 back on the transmission line in the direction toward the pump source 230. However, no reflected pump signal is transmitted through port 4 of the quadrature microwave hybrid coupler 210 toward the isolator 215A. It should be noted that even if a negligible amount of reflected pump signal is output from port 4 of the quadrature microwave hybrid coupler 210 to the isolator 215A, no extra power (or an insignificant amount) is transmitted to the JJ 250. An example of a negligible amount of reflected pump signal or power that might reach the JJ 250 could be less than 0.1 femtowatts (fW) or a small current, which is an example of a small current/power that causes no voltage drop. Because no reflected pump signal (or an insignificant amount) is transmitted to JJ 250 from port 4 of the microwave hybrid coupler 210, the JJ 250 remains in the supercurrent state also referred to as the zero-voltage state. As understood by one skilled in the art, when the current flowing in the JJ 250 is smaller than the critical current $I_c$, the voltage drop across the JJ is zero. In one implementation, the JJ 250 can be biased by a DC current $I_{BIAS}$ from, for example, a low noise DC current source. When biased, the DC current $I_{BIAS}$ is less than the supercurrent/critical current $I_c$.

The measurement device 255 is utilized to measure whether there is a voltage drop across the JJ 250. When the measurement device 255 determines that the voltage drop is zero (V=0), then V=0 indicates that no signal photons have entered the device and the JJ 250 is in the zero-voltage state/supercurrent state as recognized by the controller 280. However, when the measurement device 255 determines that voltage drop is not equal to zero (V≠0), then V≠0 indicates that the JJ 250 is in the voltage state (as recognized by the controller 280) because additional rf-current (other than $I_{BIAS}$) is flowing through the JJ 250 as discussed further in FIG. 4.

Accordingly, the threshold-detection photon detector/system 205 is configured to detect when the threshold has been met to cause a voltage drop across the JJ 250, where no voltage drop means that no microwave photons are present (i.e., no photons transmitted from the photon source 235 or entered the signal resonator 104) and where a voltage drop means that microwave photons are present (i.e., photons are transmitted from the photon source 235 via the quantum microwave signal 405 and entered the signal resonator 104).

Figure 4:
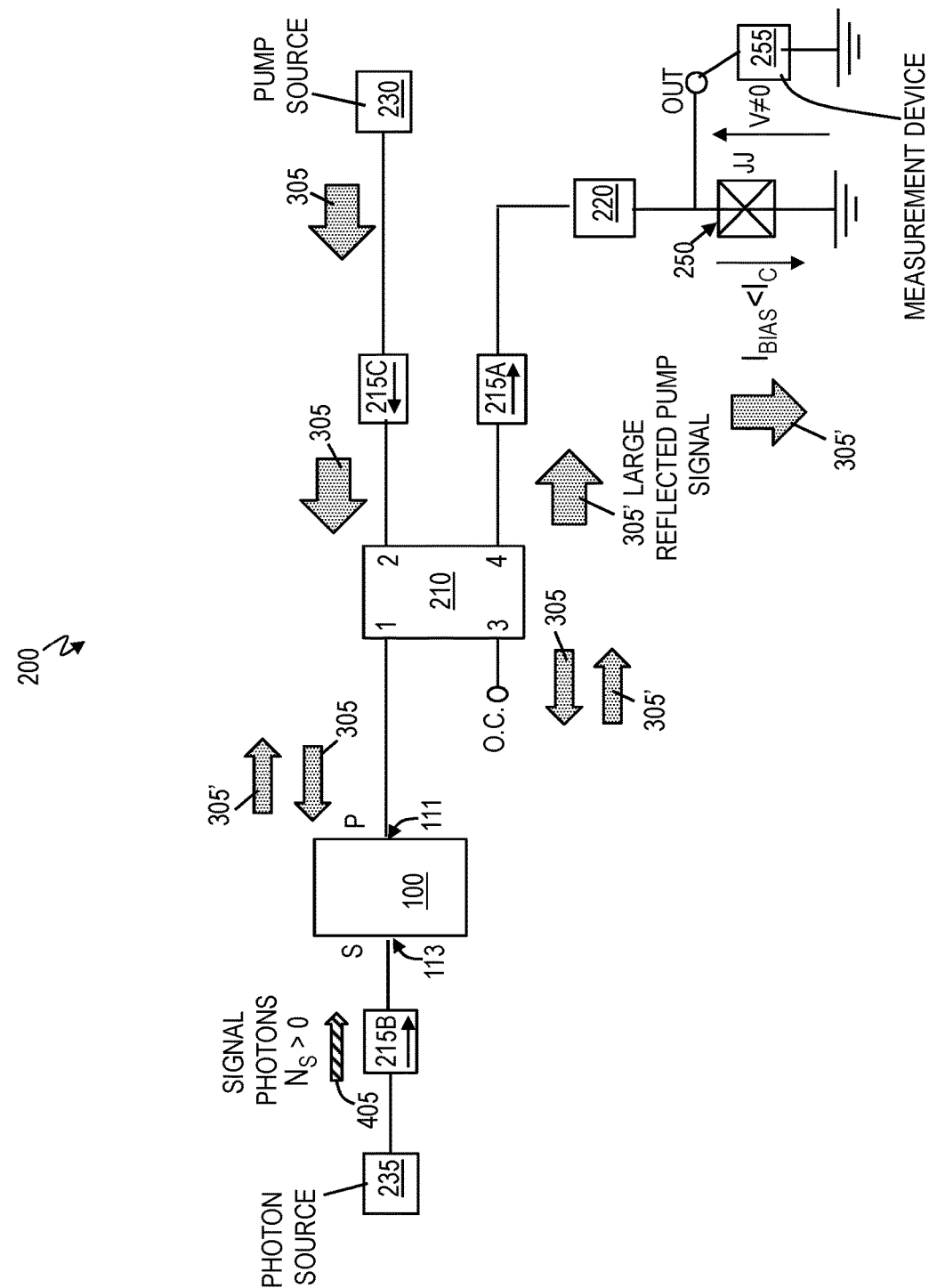
FIG. 4 is a schematic of the system depicting operation when there is an input signal of photons according to one or more embodiments.

FIG. 4 is a schematic of the system 200 depicting operation when there is an input signal of photons according to one or more embodiments. In this case, FIG. 4 illustrates a scenario in which the input signal photon (of the quantum signal 405) shifts the pump resonance frequency $f_P$ of the pump resonator 102 in the non-demolition photon detector 100 resulting in the pump drive/pump signal 305 becoming off-resonance (when previously the same pump signal 305 was on-resonance). The shifting of the pump resonance frequency $f_P$ of the pump resonator 102 in the non-demolition photon detector 100 is caused by the quantum signal 405 at frequency $f_S$ input into the non-demolition photon detector 100. Because of the shifting of the pump resonance frequency $f_P$ of the pump resonator 102 by the quantum signal 405, this causes a phase shift in the reflected pump signal 305' transmitted from the non-demolition photon detector 100 to the quadrature microwave hybrid coupler 210. As a result, the quadrature microwave hybrid coupler 210 is configured to cause a large reflected pump signal 405 to be output from port 4. More regarding the phase shift is discussed in FIGS. 9, 10, and 12. This large reflected pump signal 305' is transmitted to the JJ 250 via isolator 215A and matching network 220. Because of the large reflected pump signal 305 received by the JJ 250, the JJ 250 is shifted from the zero-voltage state/supercurrent state to the voltage state, and the measurement device 255 (and/or controller 280) determines that voltage drop is not equal to zero (V≠0), thereby indicating that photons are present (i.e., one or more photons have been transmitted from the photon source 235).

An example scenario is provided below to illustrate the difference in FIG. 4 (where at least one microwave photon in quantum signal 405 is transmitted from the photon source 235 to the non-demolition photon detector 100) versus FIG. 3 (where no quantum signal 405 is transmitted from the photon source 235 to the non-demolition photon detector 100). In FIG. 4, the microwave pump signal 305 at pump frequency $f_P$ is transmitted from the pump source 230 through the isolator 215C into port 2 of the quadrature microwave hybrid coupler 210. Because the quadrature microwave hybrid coupler 210 is a 90° hybrid coupler, ½ of the microwave pump signal 305 is split and output through ports 1 and 3. Port 3 of the quadrature microwave hybrid coupler 210 is connected to the open circuit such that the microwave pump signal 305 is transmitted to the open circuit and reflected back from the open circuit as the reflected pump signal 305'. With respect port 1, the microwave pump signal 305 is transmitted from the quadrature microwave hybrid coupler 210 to the quantum non-demolition microwave photon detector 100 at the pump port 111. The quantum non-demolition microwave photon detector 100 is configured to reflect the microwave pump signal 305 back as the reflected microwave pump signal 305'.

When the quantum (microwave) signal 405 is applied to the signal port 113 of the quantum non-demolition microwave photon detector 100 denoting that photons are present ($N_S$>0), the pump resonator 102 has a shift in its fundamental resonance frequency, which means that the pump resonance frequency $f_P$ is shifted to a different value and the frequency of the pump signal 305 does not match (or no longer matches) the pump resonance frequency $f_P$ of the pump resonator 102.

Because the quantum (microwave) signal 405 at signal frequency $f_S$ is transmitted from the photon source 235 to the quantum non-demolition microwave photon detector 100, the effective Hamiltonian of the quantum non-demolition microwave photon detector 100 which is based on Cross-Kerr nonlinearity is given by $H_{eff} = \hbar(\tilde{\omega}_P + KN_P + K'N_S)N_P + \hbar \tilde{\omega}_S N_S$, because $N_S$ is greater than 0.

The quadrature microwave hybrid coupler 210 is configured to receive at port 1 the reflected microwave pump signal 305' transmitted from the quantum non-demolition microwave photon detector 100 and to receive at port 3 the reflected microwave pump signal 305' transmitted from the open circuit. Because the frequency of the pump signal 305 is not or is no longer on-resonance with the pump resonance frequency $f_P$ of the pump resonator 102, a large reflected pump signal 305' (indicated by the large arrow) is transmitted from port 4 of the quadrature microwave hybrid coupler 210 to the JJ 250 via the isolator 215A and matching network 220. The large reflected pump signal 305' received at the JJ 250 causes a relatively large amount of power at the JJ 250 which switches the JJ 250 into the voltage state in which a voltage drop (i.e., a value of the voltage) is detected by the measurement device 255. In one implementation, an example of the power or current that can be utilized to cross the threshold in order to switch the JJ 250 to the voltage state can be 0.1 nW (nanowatts). In another implementation, an example of the power or current as the threshold in order to switch the JJ 250 to the voltage state can be 10 pW (picowatts).

Switching from the zero-voltage state/supercurrent state to the voltage state is indicative of detecting a photon via the measurement device 255. Therefore, the threshold-detection photon detector/system 205 is configured to determine that microwave photons are present (i.e., photons are transmitted from the photon source 235 via the quantum microwave signal 405) by detecting that the threshold has been met to cause a voltage drop across the JJ 250.

However, in FIG. 4, no reflected microwave pump signal 305' is transmitted from port 2 of the quadrature microwave hybrid coupler 210 back toward the pump source 230. This is because the pump signal 305 previously transmitted to the pump resonator 102 was off-resonance.

FIG. 5 is a schematic of the system 200 depicting in-situ single microwave photon detection according to one or more embodiments. FIG. 6 is a schematic of the system 200 depicting in-situ single microwave photon detection according to one or more embodiments. FIGS. 5 and 6 are partial views of the system 200 illustrating the detection process. FIG. 5 is an example of the no photons case where $N_S$=0 while FIG. 6 is an example of the signal photons case where $N_S$>0. By measuring a spike in the voltage across the JJ 250 in FIG. 6 or a lack of a spike in FIG. 5, an operator (or controller 280) can determine in-situ (inside a cryogenic apparatus, such as a dilution fridge) the presence (voltage spike) or absence (no voltage spike) of input signal photons respectively.

Figure 7:
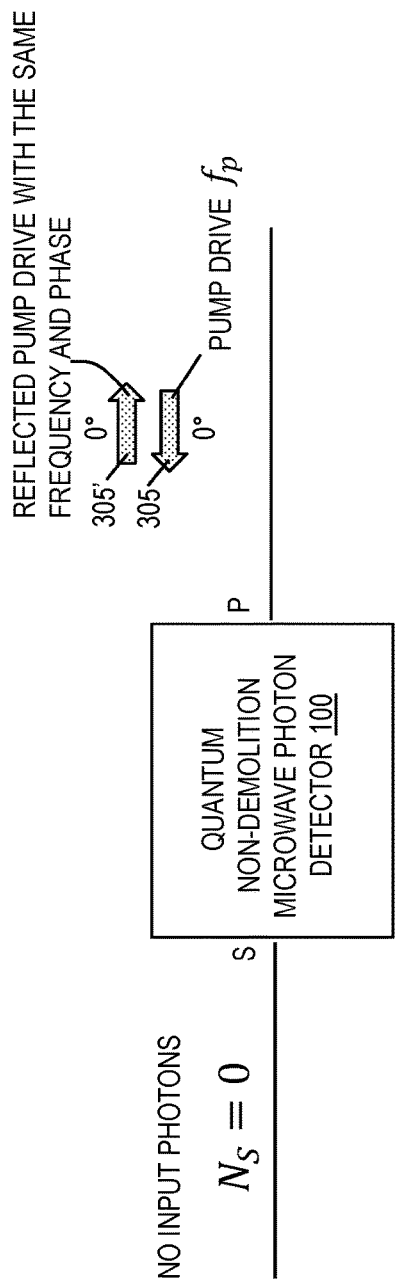
FIG. 7 is a schematic of the system depicting no input signal photon according to one or more embodiments.
Figure 8:
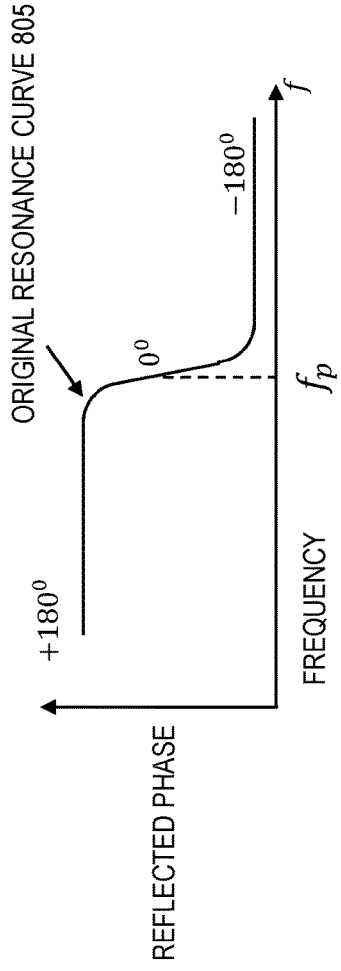
FIG. 8 is a graph characterizing the effect of the non-demolition photon detector in FIG. 7 according to one or more embodiments.

FIG. 7 is a schematic of the system 200 depicting no input signal photon according to one or more embodiments. FIG. 7 is only a partial view of the system 200 illustrating the signals on the transmission lines connected to the non-demolition photon detector 100. FIG. 8 is a graph 800 characterizing the effect of the non-demolition photon detector 100 in FIG. 7 according to one or more embodiments. In this case, the non-demolition photon detector 100 is biased on-resonance in FIG. 7 and there is no input signal photon to shift the pump resonance frequency $f_P$. Accordingly, the microwave pump signal 305 is transmitted at a frequency matching the pump resonance frequency $f_P$ such that the reflected pump signal 305' (transmitted from the non-demolition photon detector 100) does not experience a phase shift relative to the phase of the incident pump signal 305 (0° phase shift) under the condition where no quantum signal 405 is input to the non-demolition photon detector 100. This is also shown by the pump resonance curve 805 for the pump resonator 102 in the graph 800 in FIG. 8.

Figure 9:
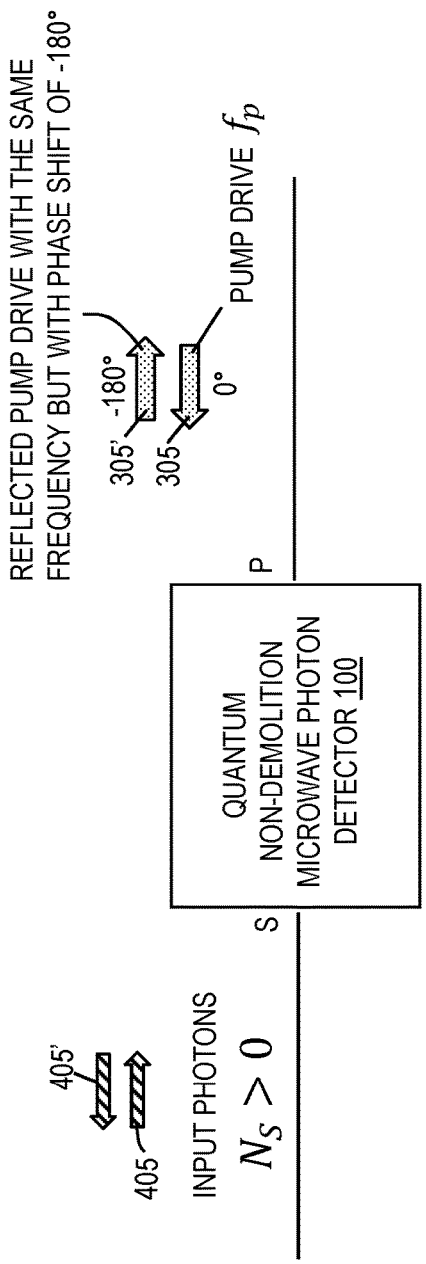
FIG. 9 is a schematic of the system depicting reception of an input signal photon according to one or more embodiments.
Figure 10:
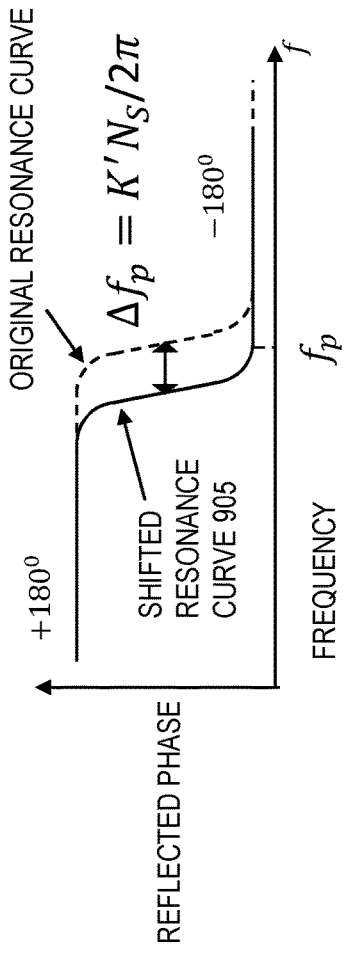
FIG. 10 is a graph characterizing the effect of the non-demolition photon detector in FIG. 9 according to one or more embodiments.

FIG. 9 is a schematic of the system 200 depicting reception of an input signal photon via the quantum microwave signal 405 according to one or more embodiments. FIG. 9 is only a partial view of the system 200 illustrating the signals on the transmission lines connected to the non-demolition photon detector 100. FIG. 10 is a graph 1000 characterizing the effect of the non-demolition photon detector 100 in FIG. 9 according to one or more embodiments. In this case, the non-demolition photon detector 100 is biased on-resonance but the presence of input signal protons (via the microwave signal 405) shifts the pump resonance frequency $f_P$ of the pump resonator 102 by $\Delta f_P = K'N_S/2\pi$, where $\Delta f_P$ denotes the shift in the pump resonance frequency $f_P$.

Accordingly, the microwave pump signal 305 is transmitted at a frequency that does not match the pump resonance frequency $f_P$ such that the pump signal 305 has 0° phase and the reflected pump signal 305' (transmitted from the nondemolition photon detector 100) has −180° phase under the condition where the quantum signal 405 is input to the non-demolition photon detector 100. This is also shown by the −180° shift in the phase of the reflected pump signal 305' between the original pump resonance curve 805 versus the shifted resonance curve 905 of the pump resonator 102 in graph 1000 in FIG. 10 at the frequency of the pump signal. This phase shift to −180° for the reflected pump signal 305' causes the JJ 250 to shift to the voltage state (i.e., V≠0).

Figure 11:
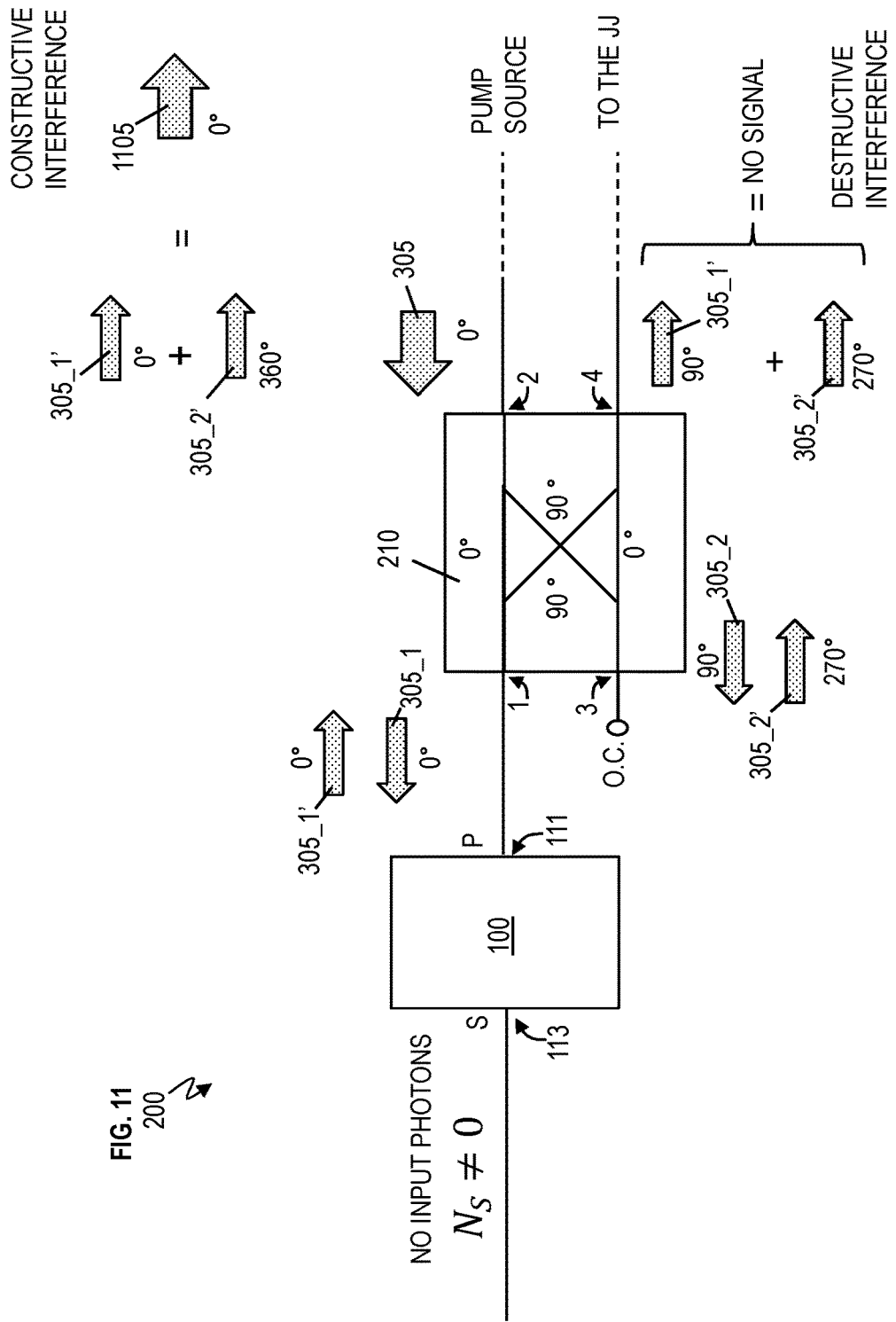
FIG. 11 is a schematic of the system depicting utilization of wave interference in the quadrature microwave hybrid coupler according to one or more embodiments.
Figure 12:
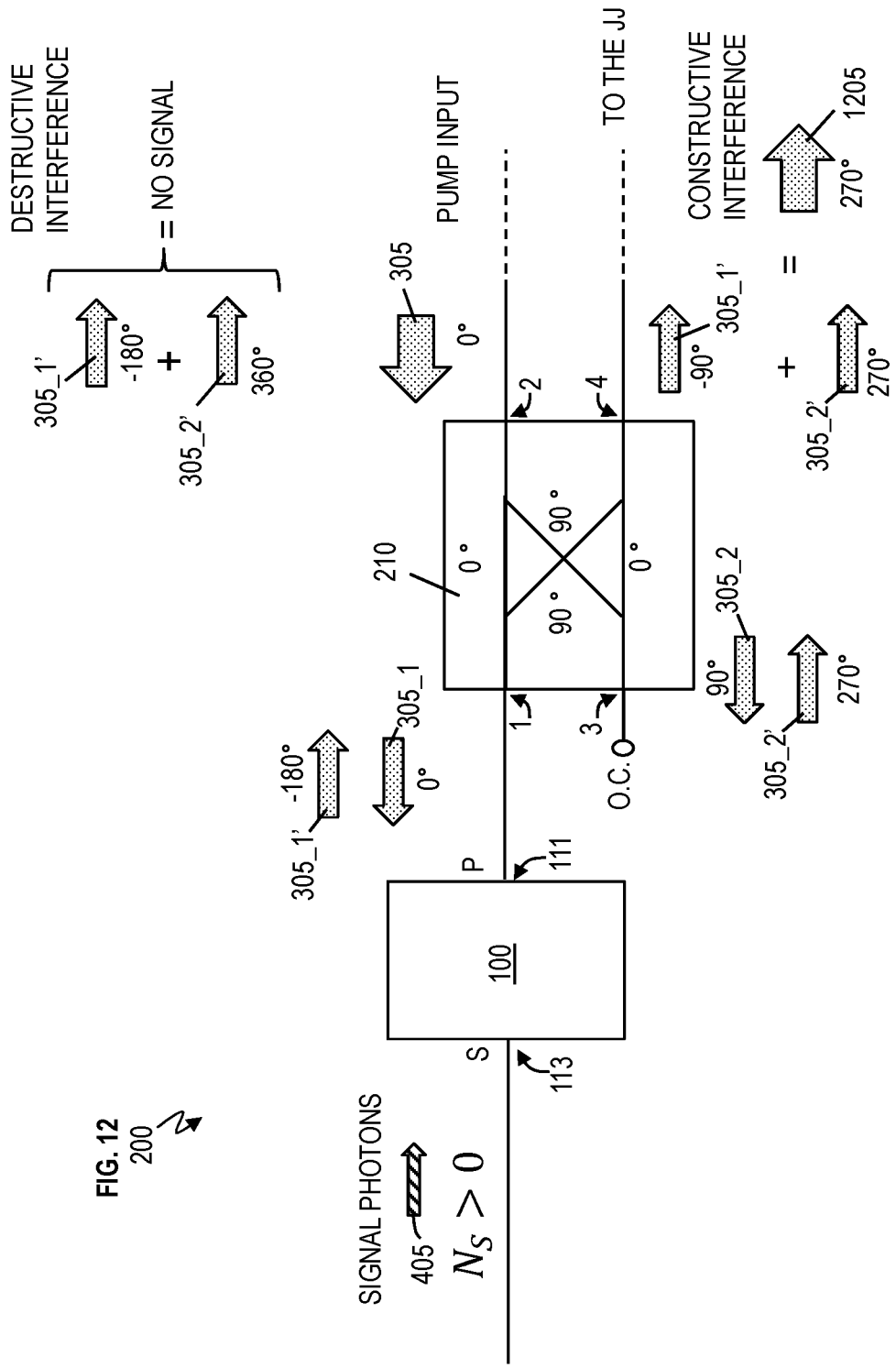
FIG. 12 is a schematic of the system depicting utilization of wave interference in the quadrature microwave hybrid coupler according to one or more embodiments.

Further details of how the phase of the reflected pump signal 305' is utilized in the threshold-detection photon detector/system 205 are discussed in FIGS. 11 and 12. FIG. 11 is a schematic of the system 200 depicting utilization of the phase of the reflected pump signal in the quadrature microwave hybrid coupler 210 according to one or more embodiments. FIG. 11 is only a partial view of the system 200 illustrating the relationship of the phase shift on the signals 305, 305' with respect to the quadrature microwave hybrid coupler 210, and to further delineate the signals 305, 305' signals designations 305_1, 305_1', 305_2, 305_2' are used for explanation purposes. FIG. 11 illustrates the case in which the lack of input signal photons causes the large pump drive to reflect off the quantum non-demolition detector towards the pump source 230.

Now, turning to the details in FIG. 11, a large pump signal 305 at the phase 0° and at the frequency $f_P$ are input into port 2 of the quadrature microwave hybrid coupler 210, and the wide arrow represents a large signal. Because the quadrature microwave hybrid coupler 210 is a 90° hybrid coupler, the quadrature microwave hybrid coupler 210 is configured to split the large pump signal 305 into ½ such that the microwave pump signal 305_1 outputs through port 1 at phase 0° and the microwave pump signal 305_2 outputs through port 3 at phase 90°. Because port 3 of the quadrature microwave hybrid coupler 210 is connected to an open circuit, the microwave pump signal 305_2 at phase 90° is reflected back (from the open circuit) to port 3 as reflected pump signal 305_2' at phase 270°. With respect port 1, the microwave pump signal 305_1 at phase 0° is transmitted from port 1 of the quadrature microwave hybrid coupler 210 to the quantum non-demolition microwave photon detector 100 at the pump port 111. Because the pump signal 305_1 is at the frequency that matches the pump resonance frequency $f_P$ of the pump resonator 102, the quantum non-demolition microwave photon detector 100 is configured to reflect the microwave pump signal 305_1 at phase 0° back to port 1 of the quadrature microwave hybrid coupler 210 as the reflected microwave pump signal 305_1' at phase 0°.

At this point, the quadrature microwave hybrid coupler 210 receives both the reflected microwave pump signal 305_1' at phase 0° into port 1 and the reflected microwave pump signal 305_2' at phase 270° into port 3. Because the quadrature microwave hybrid coupler 210 is structured to split the incoming signal in ½, to increase the phase by 90°, when it outputs the incoming signal in the cross direction, the quadrature microwave hybrid coupler 210 is configured to output ½ of reflected microwave pump signal 305_1' (previously at phase 0° and having been input at port 1) to port 4 with a phase 90° increase (i.e., 0°+90°=90°) (because of the cross direction), such that the reflected microwave pump signal 305_1' at phase 90° exits port 4. Additionally, the quadrature microwave hybrid coupler 210 is configured to output ½ of reflected microwave pump signal 305_1' (previously at phase 0° and having been input at port 1) to port 2 with a phase 0° increase (i.e., 0°+0°=0°) in the horizontal direction, such that the reflected microwave pump signal 305_1' at phase 0° exits port 2.

With respect to the reflected pump signal 305_2' at phase 270° entering port 3, the quadrature microwave hybrid coupler 210 is configured to output ½ of reflected microwave pump signal 305_2' (previously at phase 270° and having been input at port 3) to port 2 with a phase 90° increase (i.e., 270°+90°=360°) because of the cross-direction, such that the reflected microwave pump signal 305_2' at phase 360° exits port 2 of the quadrature microwave hybrid coupler 210. Additionally, the quadrature microwave hybrid coupler 210 is configured to output ½ of reflected microwave pump signal 305_2' (previously at phase 270° and having been input at port 3) to port 4 with a phase 0° increase (i.e., 0°+270°=270°) because of the horizontal direction, such that the reflected microwave pump signal 305_2' at phase 270° exits port 4 of the quadrature microwave hybrid coupler 210.

Returning on the transmission line toward the pump source 230 are reflected microwave pump signal 305_1' at phase 0° and reflected microwave pump signal 305_2' at phase 360°, and due to wave interference, the signal 305_1' at phase 0° and signal 305_2' at phase 360° constructively add/combine to generate the large reflected pump signal 1105 at phase 0°. The large reflected pump signal 1105 is the same as the large reflected pump signal 305' in FIG. 3.

However, returning on the transmission line toward the JJ 250 are reflected microwave pump signal 305_1' at phase 90° and reflected microwave pump signal 305_2' at phase 270°, and due to wave interference, the signal 305_1' at phase 90° and signal 305_2' at phase 270° destructively add/combine to destructively generate no signal. Accordingly, there is no shift in the JJ 250 from the zero-voltage state to the voltage state, and thus there is the determination (by controller 280) that no microwave photon is detected. FIG. 11 illustrates operation of the threshold-detection photon detector/system 205 as discussed in FIGS. 2, 3, 5, 7, and 8.

FIG. 12 is a schematic of the system 200 depicting utilization of the phase of the reflected pump signal in the quadrature microwave hybrid coupler 210 according to one or more embodiments. FIG. 12 is only a partial view of the system 200 illustrating the relationship of phase on the signals 305, 305', 405 with respect to the quadrature microwave hybrid coupler 210, and to further delineate the signals 305, 305' signals designations 305_1, 305_1', 305_2, 305_2' are used. FIG. 12 illustrates the case in which the presence of input signal photons causes the large pump drive to reflect off the quantum non-demolition detector towards the JJ 250, thereby causing detection of a photon.

Now, turning to the details in FIG. 12, a large pump signal 305 with phase 0° and at the frequency $f_P$ are input into port 2 of the quadrature microwave hybrid coupler 210, and the wide arrow represents a large signal. Because the quadrature microwave hybrid coupler 210 is a 90° hybrid coupler, the quadrature microwave hybrid coupler 210 is configured to split the large pump signal 305 into ½ such that the microwave pump signal 305_1 outputs through port 1 at phase 0° and the microwave pump signal 305_2 outputs through port 3 at phase 90°. Because port 3 of the quadrature microwave hybrid coupler 210 is terminated by an open circuit, the microwave pump signal 305_2 at phase 90° is reflected back (from the open circuit) to port 3 as reflected pump signal 305_2' at phase 270°. To this point, discussion of FIG. 12 has been identical to FIG. 11. With respect port 1, the microwave pump signal 305_1 at phase 0° is transmitted from port 1 of the quadrature microwave hybrid coupler 210 to the quantum non-demolition microwave photon detector 100 at the pump port 111. Concurrently, the quantum microwave signal 405 is input into the signal port 113 of the quantum non-demolition microwave photon detector 100. The quantum microwave signal 405 shifts the pump resonance frequency $f_P$. As such, the pump signal 305_1 is no longer at a frequency that matches the pump resonance frequency $f_P$ of the pump resonator 102, and because of this mismatch, the quantum non-demolition microwave photon detector 100 is configured to reflect the microwave pump signal 305_1 (transmitted at phase 0°) back to port 1 as the reflected microwave pump signal 305_1' at phase −180°. In this case, there is a −180° phase shift that occurs in the reflected microwave pump signal 305_1' that is sent back to port 1 of quadrature microwave hybrid coupler 210, as discussed in FIGS. 9 and 10.

At this point, the quadrature microwave hybrid coupler 210 receives both the reflected microwave pump signal 305_1' at phase −180° into port 1 and the reflected pump signal 305_2' at phase 270° into port 3. Because the quadrature microwave hybrid coupler 210 is structured to split the incoming signal in ½, to increase the phase by 90° for the cross direction, and to output the incoming signal in the cross direction as well as horizontally direction, the quadrature microwave hybrid coupler 210 is configured to output ½ of reflected microwave pump signal 305_1' (previously at phase −180° and having been input at port 1) to port 4 with a phase 90° increase (i.e., −180°+90°=)−90°, such that the reflected microwave pump signal 305_1' at phase −90° exits port 4 of the quadrature microwave hybrid coupler 210. Additionally, the quadrature microwave hybrid coupler 210 is configured to output ½ of reflected microwave pump signal 305_1' (previously at phase −180° and having been input at port 1) to port 2 with a phase 0° increase (i.e., −180°+0°=−180°), such that the reflected microwave pump signal 305_1' at phase −180° exits port 2.

With respect to the reflected pump signal 305_2' at phase 270° entering port 3, the quadrature microwave hybrid coupler 210 is configured to output ½ of reflected microwave pump signal 305_2' (previously at phase 270° and having been input at port 3) to port 2 with a phase 90° increase (i.e., 270°+90°=360°), such that the reflected microwave pump signal 305_2' at phase 360° exits port 2. Additionally, the quadrature microwave hybrid coupler 210 is configured to output ½ of reflected microwave pump signal 305_2' (previously at phase 270° and having been input at port 3) to port 4 with a phase 0° increase (i.e., 0°+270°=270°), such that the reflected microwave pump signal 305_2' at phase 270° exits port 4.

Returning on the transmission line toward the pump source 230 are reflected microwave pump signal 305_1' at phase −180° and reflected microwave pump signal 305_2' at phase 360°, and due to destructive wave interference, the signal 305_1' at phase −180° and signal 305_2' at phase 360° add/combine to result in no signal.

However, returning on the transmission line toward the JJ 250 are reflected microwave pump signal 305_1' at phase −90° and reflected microwave pump signal 305_2' at phase 270°, and due to constructive wave interference, the signal 305_1' at phase −90° and signal 305_2' at phase 270° add/combine to generate large reflected microwave signal 1205 (which is the same as the large reflected microwave signal 305' in FIGS. 4 and 6). Because of the large reflected microwave signal 1205 received by the JJ 250 (e.g., 1 nW or more), there is a shift in the JJ 250 from the zero-voltage state to the voltage state, and thus there is the determination by the controller 280 that a microwave photon is detected.

FIG. 12 illustrates operation of the threshold-detection photon detector/system 205 as discussed in FIGS. 2, 4, 6, 9, and 10.

The quantum non-demolition microwave photon detector 100 including the capacitors (with the exception of the dielectric material in the capacitors), transmission lines, Josephson junctions 110, 250 (with the exception of the thin insulating material), resonators 102, 104, and matching network 220 are made of superconducting material. Additionally, the quadrature microwave 90° hybrid coupler 210 is made of low-loss normal metals or can be made of superconducting material. Also, the qubit-resonator system is made of superconducting material. Examples of superconducting materials (at low temperatures, such as about 10-100 millikelvin (mK), or about 4 K) include niobium, aluminum, tantalum, etc.

The threshold-detection photon detector/system 205 and/or the system 200 are configured to promote scalability by reducing the number of output lines coming out of a dilution fridge housing a superconducting quantum processer. Also, this scheme can be readily extended to a large number of qubits. The threshold-detection photon detector/system 205 and/or the system 200 add protection to the quantum system because by eliminating the output line, the system 200, 205 is configured to prevent thermal and electromagnetic noise (originating outside the fridge or generated by active devices) on the output lines to propagate down to the quantum system and affect its coherence.

The threshold-detection photon detector/system 205 and/or the system 200 allow for in-situ measurement of the quantum state without exiting the fridge. The threshold-detection photon detector/system 205 and/or the system 200 close the feedback loop inside the fridge, by incorporating a decision making mechanism (i.e., controller 280) inside the fridge. The controller 280 makes decisions based on these measurements and applies feedback drive signals (e.g., via rapid single flux quantum (RSFQ)/field-programmable gate array (FPGA) circuits). By closing the feedback loop inside the fridge, the electrical length of the loop gets considerably shorter, thus allowing for faster feedback cycles.

Further, in the system 200, the quantum system can be probed or measured at room temperature fairly easily by connecting an output line to the third port of a cryogenic circulator inserted in between the quantum system (e.g., photon source 235) and the non-demolition microwave photon detector 100 (on the signal side).

Figure 13:
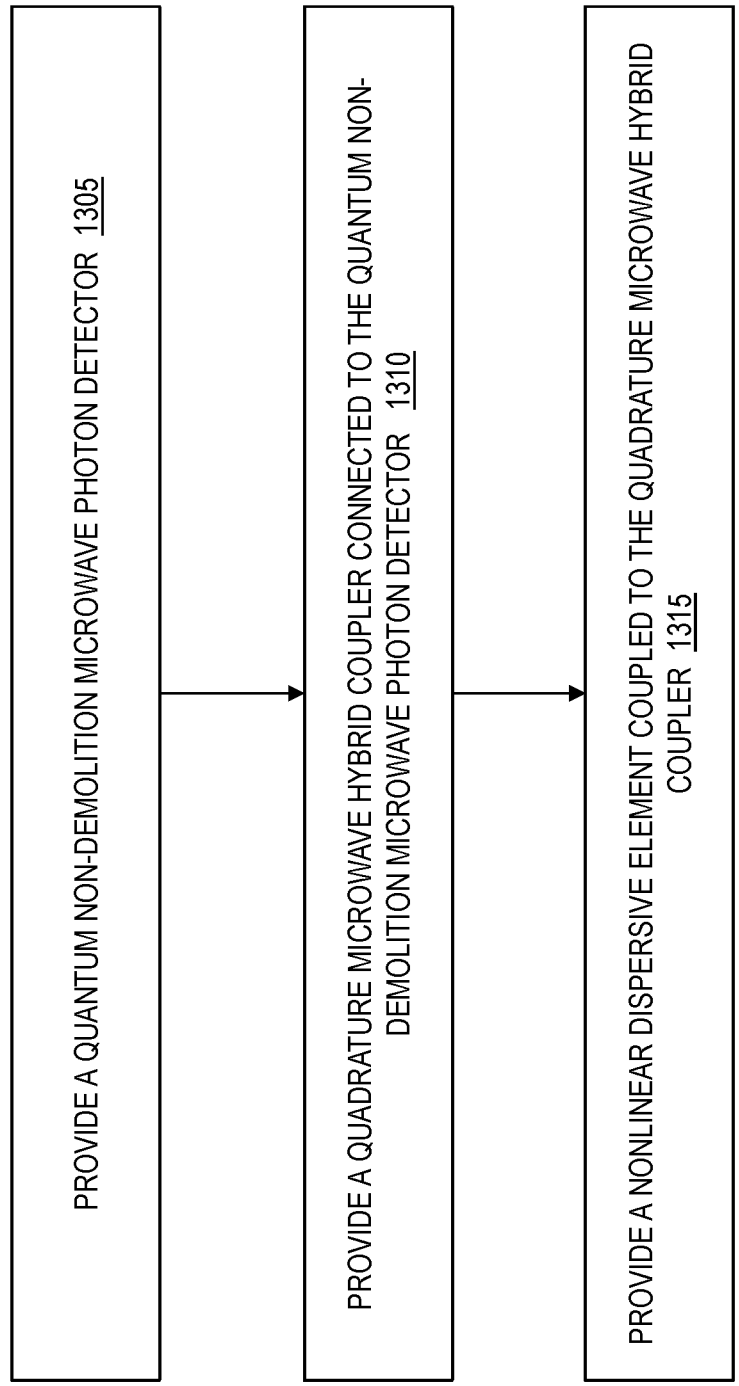
FIG. 13 is a flow chart of a method of forming a threshold-detection microwave detection device according to one or more embodiments.

FIG. 13 is a flow chart 1300 of a method of forming a threshold-detection microwave detection device 205 according to one or more embodiments. At block 1305, a quantum non-demolition microwave photon detector 100 is provided. At block 1310, a quadrature microwave hybrid coupler 210 is connected to the quantum non-demolition microwave photon detector 100. A dispersive nonlinear element 250 is coupled to the quadrature microwave hybrid coupler 210.

The dispersive nonlinear element 250 is configured to switch to a voltage state indicating a detection of a microwave photon. The voltage state corresponds to there being a voltage drop across the dispersive nonlinear element 250. The dispersive nonlinear element 250 is configured to be in a zero-voltage state indicating no detection of a microwave photon. The zero-voltage corresponds to there being no voltage drop across the dispersive nonlinear element 250. The dispersive nonlinear element 250 is a Josephson junction. The dispersive nonlinear element is a direct current (DC) superconducting quantum interference device (SQUID).

An isolator 215A is connected in between the quadrature microwave hybrid coupler 210 and the dispersive nonlinear element 250. The quantum non-demolition microwave photon detector 100 is configured to receive a microwave signal 405 and a pump signal 305, such that the dispersive nonlinear element 250 switches to a voltage state thereby detecting a microwave photon in the microwave signal 405. A measurement device 255 is configured to detect a microwave photon by measuring a non-zero voltage across the dispersive nonlinear element 250.

FIG. 14 is a flow chart 1400 of a method of detecting a microwave photon according to one or more embodiments. At block 1405, a quadrature microwave hybrid coupler 210 is configured to receive (e.g., in port 1) a reflected microwave pump signal 305' from a quantum non-demolition microwave device 100. At block 1410, a measurement device 255 and/or a controller 280 is configured to determine a presence of the microwave photon based on a dispersive nonlinear element 250 being in a voltage state, where the dispersive nonlinear element 250 is coupled to the quadrature microwave hybrid coupler 210.

The microwave photon has been input to the quantum non-demolition microwave device 100 in a quantum microwave signal 405. The quadrature microwave hybrid coupler 210 outputs a portion of the reflected microwave signal 305' to the dispersive nonlinear element 250.

Figure 15:
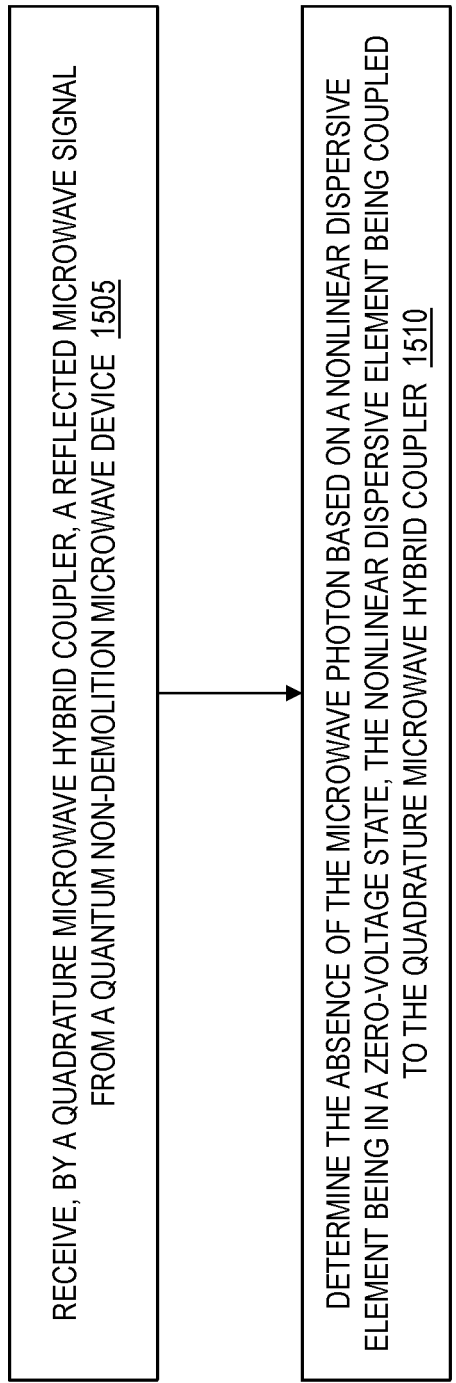
FIG. 15 is a flow chart of a method of detecting an absence of a microwave photon according to one or more embodiments.

FIG. 15 is a flow chart 1500 of a method of detecting an absence of a microwave photon according to one or more embodiments. At block 1505, a quadrature microwave hybrid coupler 210 is configured to receive a reflected microwave pump signal 305' from a quantum non-demolition microwave device 100. At block 1510, a measurement device 255 and/or a controller 280 is configured to determine the absence of the microwave photon based on a dispersive nonlinear element 250 being in a zero-voltage state, where the dispersive nonlinear element 250 is coupled to the quadrature microwave hybrid coupler 210.

The dispersive nonlinear element 250 being in the zero-voltage state is indicative of no microwave photon being input to the quantum non-demolition microwave device 100 from a quantum source 235.

Technical benefits include a threshold-detection non-demolition photon detector/system. As technical benefits, the output voltage signal which indicates the presence or lack of signal photons can be measured in-situ in a dilution fridge using rapid single flux quantum (RSFQ) electronics or semiconductor based electronics. As a result, there is no need to measure the output signal of the quantum signal outside the fridge using room-temperature equipment. Furthermore, such voltage measurements would allow one to apply feedback signals back to the quantum signal source without exiting the fridge. In other words, it also allows one to close the quantum feedback loop inside the fridge. Such capability reduces the number of output lines and hardware, such as quantum-limited amplifiers, circulators, high-electron-mobility transistors (HEMTs), coax cables, needed in order to realize a scalable superconducting quantum processor. Also, by reducing the number of output lines and hardware, this shortens the duration of the quantum loop (i.e., speed up the feedback rate or allow more time for computation and decision making), and also eliminates possible sources of noise which propagate down the output lines or generated by the active components (i.e., amplifiers) in the output lines. The quantum signal coming out from the quantum system and reflecting off the non-demolition photon detector at the signal port can be amplified using quantum-limited amplifiers and measured using standard room-temperature equipment. This capability can be useful for debugging or monitoring purposes.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A microwave detection device comprising:
a quantum non-demolition microwave photon detector;
a quadrature microwave hybrid coupler coupled to the quantum non-demolition microwave photon detector, the quadrature microwave hybrid coupler comprising four ports, wherein one port of the four ports is coupled to the quantum non-demolition microwave photon detector; and
a dispersive nonlinear element coupled to the quadrature microwave hybrid coupler, wherein another port of the four ports is coupled to the dispersive nonlinear element.

2. The microwave detection device of claim 1, wherein the dispersive nonlinear element is configured to switch to a voltage state indicating a detection of a microwave photon.

3. The microwave detection device of claim 2, wherein the voltage state corresponds to there being a voltage drop across the dispersive nonlinear element.

4. The microwave detection device of claim 1, wherein the dispersive nonlinear element is configured to be a zero-voltage state indicating no detection of a microwave photon.

5. The microwave detection device of claim 4, wherein the zero-voltage state corresponds to there being no voltage drop across the dispersive nonlinear element.

6. The microwave detection device of claim 1, wherein the dispersive nonlinear element is a Josephson junction.

7. The microwave detection device of claim 1, wherein the dispersive nonlinear element is a direct current (DC) superconducting quantum interference device (SQUID).

8. The microwave detection device of claim 7, wherein the quantum non-demolition microwave photon detector is configured to receive a microwave signal and a pump signal, such that the dispersive nonlinear element switches to a voltage state thereby detecting a microwave photon in the microwave signal.

9. The microwave detection device of claim 1, wherein an isolator is connected in between the quadrature microwave hybrid coupler and the dispersive nonlinear element.

10. The microwave detection device of claim 1 further comprising a measurement device configured to detect a microwave photon by measuring a non-zero voltage across the dispersive nonlinear element.

11. A method of forming a microwave detection device, the method comprising:
    providing a quantum non-demolition microwave photon detector;
    providing a quadrature microwave hybrid coupler connected to the quantum non-demolition microwave photon detector, the quadrature microwave hybrid coupler comprising four ports, wherein one port of the four ports is coupled to the quantum non-demolition microwave photon detector; and
    providing a dispersive nonlinear element coupled to the quadrature microwave hybrid coupler, wherein another port of the four ports is coupled to the dispersive nonlinear element.

12. The method of claim 11, wherein the dispersive nonlinear element is configured to switch to a voltage state indicating a detection of a microwave photon.

13. The method of claim 12, wherein the voltage state corresponds to there being a voltage drop across the dispersive nonlinear element.

14. The method of claim 11, wherein the dispersive nonlinear element is configured to be a zero-voltage state indicating no detection of a microwave photon.

15. The method of claim 14, wherein the zero-voltage state corresponds to there being no voltage drop across the dispersive nonlinear element.

16. The method of claim 11, wherein the dispersive nonlinear element is a Josephson junction.

17. The method of claim 11, wherein the dispersive nonlinear element is a DC SQUID.

18. The method of claim 17, wherein the quantum non-demolition microwave photon detector is configured to receive a microwave signal and a pump signal, such that the dispersive nonlinear element switches to a voltage state thereby detecting a microwave photon in the microwave signal.

19. The method of claim 11, wherein an isolator is connected in between the quadrature microwave hybrid coupler and the dispersive nonlinear element.

20. The method of claim 11, wherein a measurement device is configured to detect a microwave photon by measuring a non-zero voltage across the dispersive nonlinear element.

21. A method of detecting a microwave photon, the method comprising:
    receiving, by a quadrature microwave hybrid coupler, a reflected microwave signal from a quantum non-demolition microwave device, the quadrature microwave hybrid coupler comprising four ports, wherein one port of the four ports is coupled to the quantum non-demolition microwave photon detector; and
    determining a presence of the microwave photon based on a dispersive nonlinear element being in a voltage state, the dispersive nonlinear element being coupled to the quadrature microwave hybrid coupler, wherein another port of the four ports is coupled to the dispersive nonlinear element.

22. The method of claim 21, wherein the microwave photon has been input to the quantum non-demolition microwave device in a quantum microwave signal.

23. The method of claim 21, wherein the quadrature microwave hybrid coupler outputs a portion of the reflected microwave signal to the dispersive nonlinear element.

24. A method of detecting an absence of a microwave photon, the method comprising:
    receiving, by a quadrature microwave hybrid coupler, a reflected microwave signal from a quantum non-demolition microwave device, the quadrature microwave hybrid coupler comprising four ports, wherein one port of the four ports is coupled to the quantum non-demolition microwave photon detector; and
    determining the absence of the microwave photon based on a dispersive nonlinear element being in a zero-voltage state, the dispersive nonlinear element being coupled to the quadrature microwave hybrid coupler, wherein another port of the four ports is coupled to the dispersive nonlinear element.

25. The method of claim 24, wherein the dispersive nonlinear element being in the zero-voltage state is indicative of no microwave photon being input to the quantum non-demolition microwave device from a quantum source.

* * * * *